(12) United States Patent
Lien

(10) Patent No.: US 8,860,599 B1
(45) Date of Patent: Oct. 14, 2014

(54) ANALOG-TO-DIGITAL CONVERSION APPARATUS AND METHOD CAPABLE OF ACHIEVING FAST SETTLING

(71) Applicant: Mediatek Inc., Hsin-Chu (TW)

(72) Inventor: Yuan-Ching Lien, Taipei (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/911,082

(22) Filed: Jun. 6, 2013

(51) Int. Cl.
H03M 1/34 (2006.01)

(52) U.S. Cl.
CPC ..................................... *H03M 1/34* (2013.01)
USPC ........................... 341/158; 341/155; 341/156

(58) Field of Classification Search
CPC ........................................................ H03M 1/00
USPC ........................... 341/155, 158, 144, 156, 163
See application file for complete search history.

(56) References Cited

U.S. PATENT DOCUMENTS

| | | | | |
|---|---|---|---|---|
| 4,196,420 | A * | 4/1980 | Culmer et al. | 341/156 |
| 5,426,431 | A * | 6/1995 | Ryu | 341/158 |
| 5,489,904 | A * | 2/1996 | Hadidi | 341/156 |
| 6,466,149 | B2 * | 10/2002 | Tabler | 341/144 |
| 6,608,580 | B2 * | 8/2003 | Hsueh | 341/155 |
| 7,158,070 | B1 * | 1/2007 | Yang et al. | 341/163 |
| 7,876,254 | B2 * | 1/2011 | Berens et al. | 341/163 |
| RE42,878 | E * | 11/2011 | Chen et al. | 341/156 |
| 2002/0154049 | A1 * | 10/2002 | Hsueh | 341/161 |
| 2007/0115159 | A1 * | 5/2007 | Tachibana et al. | 341/144 |

OTHER PUBLICATIONS

Zhiheng Cao et al., ISSCC 2008 / Session 30 / Data-Converter Techniques / 30.2, A 32mW 1.25GS/s 6b 2b/step SAR ADC in 0.13μm CMOS, Feb. 6, 2008.
Wenbo Liu et al., ISSCC 2009 / Session 4 / High-Speed Data Converters / 4.5, A 600MS/s 30mW 0.13μm CMOS ADC Array Achieving Over 60dB SFDR with Adaptive Digital Equalization, Feb. 9, 2009.
Hegong Wei et al., ISSCC 2011 / Session 10 / Nyquist-Rate Converters / 10.5, A 0.024mm2 8b 400MS/s SAR ADC with 2b/Cycle and Resistive DAC in 65nm CMOS, Feb. 22, 2011.
Ying-Zu Lin et al., 2010 Symposium on VLSI Circuits/Technical Digest of Technical Papers, A 9-bit 150-MS/s 1.53-mW Subranged SAR ADC in 90-nm CMOS, pp. 243-244, 2010.
Yung-Hui Chung et al., 2011 Symposium on VLSI Circuits Digest of Technical Papers, A 16-mW 8-Bit 1-GS/s Subranging ADC in 55nm CMOS, pp. 128-129, 2011.

\* cited by examiner

*Primary Examiner* — Jean B Jeanglaude
(74) *Attorney, Agent, or Firm* — Winston Hsu; Scott Margo

(57) ABSTRACT

A method utilized in an analog-to-digital conversion apparatus, for converting an analog input signal into a digital output signal including a first portion and a second portion, includes: using a comparator circuit to compare the analog input signal with at least one first reference level to generate a preliminary comparison result, the at least one first reference level being used for determining the first portion; estimating the first portion according to the preliminary comparison result; based on the preliminary comparison result, performing the successive approximation procedure to obtain a posterior comparison result according to a plurality of second reference levels, the second reference levels being used for determining the second portion; and, estimating the second portion according to the posterior comparison result. The preliminary and posterior comparison results are generated by the comparator circuit.

11 Claims, 4 Drawing Sheets

ANALOG-TO-DIGITAL CONVERSION APPARATUS AND METHOD CAPABLE OF ACHIEVING FAST SETTLING

BACKGROUND

In general, a conventional analog-to-digital converter with successive approximation register operation (SAR ADC) is attractive for medium to high bit resolution due to an excellent power efficiency. However, the conventional SAR ADC requires several clock cycle to complete one bit conversion and is also limited to low-bandwidth application. The advance of MOS technology and a 2-b/step design extends the conversion rate to hundreds of MHz. Unfortunately, the need of multiple capacitive digital-to-analog converters (DAC) for the 2-bit SAR ADC results in large input loading. Due to this, the application for higher resolution is constrained. A conventional resistive DAC-based design may be employed to try to alleviate this problem. Unfortunately, a large number of switches and complex routing of the resistive DAC limits its references settling time and conversion rate.

SUMMARY

Therefore, one of the objectives of the present invention is to provide an analog-to-digital conversion apparatus and a method utilized in the analog-to-digital conversion apparatus, to solve the above-mentioned problems.

According to an embodiment of the present invention, a method utilized in an analog-to-digital conversion apparatus, for converting an analog input signal into a digital output signal, is disclosed. The digital output signal includes a most significant bit portion and a least significant bit portion. The method comprising: using a comparator circuit to compare the analog input signal with at least one first reference level to generate a preliminary comparison result without using a successive approximation procedure, the at least one first reference level being used for determining the most significant bit portion; estimating the most significant bit portion according to the preliminary comparison result; based on the preliminary comparison result, performing the successive approximation procedure to obtain a posterior comparison result according to a plurality of second reference levels, the second reference levels being used for determining the least significant bit portion; and, estimating the least significant bit portion according to the posterior comparison result.

According to the embodiment of the present invention, an analog-to-digital conversion apparatus for converting an analog input signal into a digital output signal is disclosed. The digital output signal includes a most significant bit portion and a least significant bit portion. The analog-to-digital conversion apparatus comprises a first digital-to-analog converter (DAC), a second DAC, a comparator circuit, and a decoder. The first DAC is used for providing at least one first reference level for the comparator circuit, and the at least one first reference level is used for determining the most significant bit portion. The second DAC is used for providing a plurality of second reference levels for the comparator circuit, and the second reference levels is used for determining the least significant bit portion. The comparator circuit is coupled to the first DAC and the second DAC, and used for comparing the analog input signal with the at least one first reference level to generate a preliminary comparison result without using a successive approximation procedure. The decoder is coupled to the comparator circuit and used for estimating the most significant bit portion according to the preliminary comparison result. Based on the preliminary comparison result, the decoder is used with the comparator circuit to perform the successive approximation procedure to obtain a posterior comparison result according to the second reference levels, and the decoder is arranged to estimate the least significant bit portion according to the posterior comparison result.

According to an embodiment of the present invention, an analog-to-digital conversion (ADC) apparatus for converting an analog input signal into a digital output signal is disclosed. The digital output signal includes a first portion and a second portion. The analog-to-digital conversion apparatus comprises a first digital-to-analog converter (DAC), a second DAC, a comparator circuit, and a decoder. The first DAC is used for providing at least one first reference level being used for determining the first portion. The second DAC is used for providing at least one second reference level being used for determining the second portion. The comparator circuit is coupled to the first DAC and the second DAC, and used for comparing the analog input signal with the at least one first reference level to generate a preliminary comparison result at an output of the comparator circuit, and for generating a posterior comparison result at the output according to the analog input signal and the at least one second reference level. The decoder is coupled to the comparator circuit, and used for estimating the first portion according to the preliminary comparison result, and for estimating the second portion according to the posterior comparison result.

Based on the embodiment of the present invention, fast settling of the reference level (s) for the comparison of the most significant bit portion is obtained. Further, by using the capacitive interpolation, a number of NMOS transistor switches can be reduced, and a matching requirement of corresponding circuitry elements can be lowered down. The need of specific duty cycle of an external clock for defining sampling period in a conventional asynchronous successive approximation analog-to-digital converter can be avoided. In addition, according to the above-mentioned design, the analog-to-digital conversion apparatus consumes less power and occupies a smaller area of a chip die. Also, a large number of switches and a complicated routing are reduced greatly.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
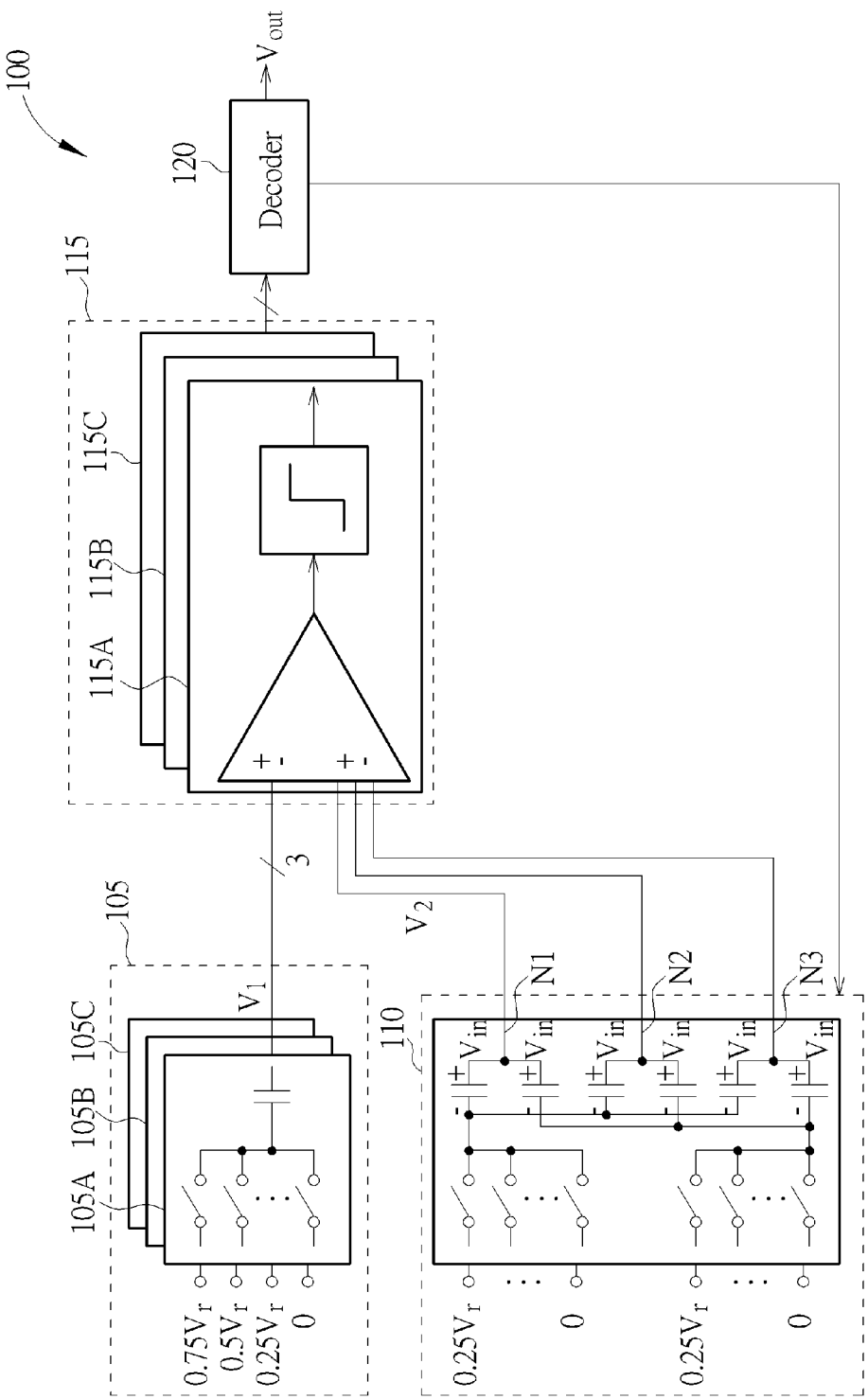
FIG. 1 is a diagram of an analog-to-digital conversion (ADC) apparatus according to an embodiment of the present invention.

Please refer to FIG. 1, which is a diagram of an analog-to-digital conversion (ADC) apparatus 100 according to an embodiment of the present invention. As shown in FIG. 1, the analog-to-digital conversion (ADC) apparatus 100 is used for converting an analog input signal $V_{in}$ into a digital output signal $V_{out}$, and it comprises a first digital-to-analog converter (DAC) 105, a second DAC 110, a comparator circuit 115, and a decoder 120. The first DAC 105 is arranged to provide at least one first level $V_1$ for the comparator circuit 115 based on at least one first reference level (i.e. input level(s) of the first DAC 105). The at least one first reference level is utilized for determining/estimating a first portion of a digital codeword of the digital output signal $V_{out}$, such as a most significant bit (MSB) portion. In this embodiment, the first level(s) $V_1$ can be equivalent to the first reference level(s). The second DAC 110 is arranged to sample and store the analog input signal $V_{in}$ and provide a plurality of second levels $V_2$ that are generated by adding second reference levels to the sampled analog input signal $V_{in}$ for the comparator circuit 115. The second reference levels (i.e. the inputs of the second DAC 110) are utilized for determining/estimating a second portion of the digital codeword of the digital output signal $V_{out}$, such as a least significant bit (LSB) portion. Examples in following paragraphs use the first DAC 105 to generate the MSB portion and the second DAC 110 to generate the LSB portion. However, with slight modifications, the first DAC 105 may be used to generate other portion, such as a center significant bit (CSB) portion or a LSB portion of the digital codeword of the digital output signal $V_{out}$, and the second DAC 110 may be used to generate a MSB portion or a CSB portion. In this embodiment, the digital codeword of the digital output signal $V_{out}$ is formed by the MSB portion and the LSB portion without other bits. However, this is not meant to be a limitation of the present invention. In other embodiments, the digital codeword may be formed by other bit(s) such as a CSB portion.

The comparator circuit 115 is arranged to receive the at least one first level $V_1$ before receiving the second levels $V_2$. The operation of estimating the MSB portion is performed before estimating the LSB portion. At first, the analog input signal $V_{in}$ is sampled and stored at the capacitors in the second DAC 110, and the decoder 120 is arranged to enable the first DAC 105 (e.g. to turn on the selected switch(es) of the first DAC 105) and disable the second DAC 110 (e.g. to turn off the switches of the second DAC 110), so that the comparator circuit 115 receives the at least one first level $V_1$ generated by the first DAC 105 and the analog input signal $V_{in}$. When receiving the at least one first level $V_1$, the comparator circuit 115 is arranged to compare the analog input signal $V_{in}$ with the at least one first level $V_1$ (which is the same as the first reference level in this embodiment) to generate a preliminary comparison result, and the decoder 120 estimates the MSB portion according to the preliminary comparison result. It should be noted that the operation of generating the preliminary comparison result is performed without using a successive approximation procedure.

After estimating the MSB portion by the comparator circuit 115, the decoder 120 is used with the comparator circuit 115 to perform a successive approximation procedure to obtain a posterior comparison result according to the above-mentioned second levels $V_2$ that are generated from the second DAC 110. The decoder 120 is then arranged to determine the codeword of the digital output signal $V_{out}$ by estimating the LSB portion according to the estimated MSB portion. In detail, the decoder 120 is arranged to enable the second DAC 110 and control on/off states of transistor switches in the second DAC 110 so as to provide appropriate second levels $V_2$, and initiate and execute the successive approximation procedure to estimate the LSB portion. The second levels $V_2$ are resultant levels generated from adding the analog input signal $V_{in}$ to the input voltages of the second DAC 110. In other words, the comparator circuit 115 is arranged to compare the at least one first reference level $V_1$ with a level generated from the analog input signal $V_{in}$ and the second reference levels, so as to perform the successive approximation procedure to obtain the posterior comparison result. It should be noted that the second levels $V_2$ are adjusted sequentially by adding the inputs of the second DAC 110 to the analog input signal $V_{in}$; and, the comparator circuit 115 is arranged to compare the at least one first reference level $V_1$ with the sequentially adjusted level step-by-step to obtain the posterior comparison result. In this embodiment, the second levels $V_2$ are adjusted gradually each time when estimating one bit of the LSB portion by adding the inputs of the second DAC 110 to the analog input signal $V_{in}$.

The comparator circuit 115 is arranged to compare the corresponding resultant level with a selected first reference level $V_1$ provided by the first DAC 105, and a comparison result is outputted to the decoder 120 so that the decoder 120 can determine a most important bit (the first bit) of the LSB portion. Then, the decoder 120 is arranged to appropriately control on/off states of the transistor switches in the second DAC 110 so that the second DAC 110 provides a corresponding second level $V_2$ to the comparator circuit 115. Then, after the comparison operation of the comparator circuit 115, the decoder 120 can determine the second bit of the LSB portion. Thus, during the successive approximation procedure of this embodiment, by controlling on/off states of the transistor switches in the second DAC 110 to step-by-step adjust a level of the analog input signal $V_{in}$ based on the second reference levels and comparing a corresponding first level $V_1$ with the adjusted levels, the decoder 120 can correctly estimate the LSB portion according to the MSB portion estimated by the decoder 120 itself. The rest operation may be deduced by analogy, and is not detailed for brevity.

Specifically, the second DAC 110 is a capacitive DAC such as a capacitor array, and the capacitive DAC 110 is used for receiving the second reference levels which are used by the above-mentioned successive approximation procedure to estimate the LSB portion. In order to significantly decrease settling time of the capacitive DAC, the first DAC 105 is used for estimate a portion of bit(s) (i.e. the MSB portion) of the digital output signal $V_{out}$ before the successive approximation procedure is employed for estimating the LSB portion. Accordingly, a level range formed by the second reference levels can be greatly decreased, and the settling time resulting from the successive approximation procedure can be greatly reduced. Thus, the whole time period required for estimating the digital codeword of the digital output signal $V_{out}$ can also be greatly reduced. The level range of the second reference levels is decreased from a full swing range of the analog input signal $V_{in}$ to a portion of the full swing range rather than the full swing range. In this embodiment, the MSB portion includes MN bit(s), and the level range of the second reference levels is determined by dividing the full swing range by $2^{MN}$. The settling time of the second DAC 110 is reduced due to the decreased level range. Also, the decreased level range is helpful for circuitry implementations in the advance of MOS technology.

For achieving the purpose of decreasing settling time of the capacitive DAC 110, in this embodiment, the first DAC 105 and the capacitive DAC 110 share the same comparator circuit, i.e. the comparator circuit 115. That is, the operation of estimating the MSB portion shares the same comparison operation of the comparator circuit 115 with the operation of estimating the LSB portion. An estimation of the MSB portion and an estimation of the LSB portion are performed or obtained by using the same comparison operation of the comparator circuit 115. Thus, it is not required to employ individual and over-range comparators for the operation of estimating the MSB portion and error correction. As shown in FIG. 1, the comparator circuit 115 includes two input signal paths wherein one is arranged to receive the at least one first level $V_1$ and the other is arranged to receive the second levels $V_2$. Detail operation is described in the following.

In this embodiment, the analog-to-digital conversion apparatus 100 is arranged to convert the analog input signal $V_{in}$ into the digital output signal $V_{out}$ with a resolution of N bits. For example, N bits can be eight bits; however, the bit resolution is merely used as an example rather than a limitation of the present invention. The first DAC 105 generates and provides first reference level(s) $V_1$ numbered $2^{MN}-1$ for the comparator circuit 115, and the comparator circuit 115 is arranged to estimate most significant bit(s) of the digital output signal $V_{out}$. MN indicates that the MSB portion includes MN bit(s) wherein MN is a positive integer. In addition, LN indicates that the LSB portion includes LN bit(s) wherein LN is also a positive integer. In this embodiment, MN is equal to two, and LN is equal to six. That is, the first DAC 105 provides three first reference levels for the comparator circuit 115, and the decoder 120 is used with the comparator circuit 115 to estimate two most significant bits (MSB) of the digital codeword of the digital output signal $V_{out}$. These first reference levels are implemented by employing $\frac{1}{4}*V_r$, $\frac{1}{2}*V_r$, and $\frac{3}{4}*V_r$ (i.e., $0.25V_r$, $0.5V_r$, and $0.75V_r$) wherein $V_r$ indicates a full voltage swing range of the analog input signal $V_{in}$. The required reference voltage is lowered to $\frac{3}{4}*V_r$ (i.e., $0.75V_r$) for the analog input signal $V_{in}$ having a full swing $V_r$.

In practice, the first DAC 105 may include three blocks 105A-105C that are respectively used for generating the three different reference levels (e.g., $\frac{1}{4}*V_r$, $\frac{1}{2}*V_r$, and $\frac{3}{4}*V_r$). Each block of the first DAC 105 is implemented by using a capacitor and a plurality of switches such as NMOS transistors. Each block of the first DAC 105 is not required to wait for a longer settling time of capacitor charging/discharging due to switches' on/off switching because each block of the first DAC 105 in this embodiment is arranged to provide a corresponding and constant voltage reference level, respectively. For instance, the block 105A may be used for providing a reference level $\frac{3}{4}*V_r$, the block 105B may be used for providing a reference level $\frac{1}{2}*V_r$, and the block 105C may be used for providing a reference level $\frac{1}{4}*V_r$. Also, the comparator circuit 115 may include three comparator blocks 115A-115C corresponding to the above-mentioned blocks 105A-105C of the first DAC 105. The three comparator blocks 115A-115C also correspond to the three output nodes N1-N3 of the second DAC 110, respectively. The comparator blocks 115A-115C are arranged to compare the level of the analog input signal $V_{in}$ with the first reference levels $\frac{3}{4}*V_r$, $\frac{1}{2}*V_r$, and $\frac{1}{4}*V_r$, respectively, to generate a preliminary comparison result and output the preliminary comparison result to the decoder 120. According to the preliminary comparison result, the decoder 120 can determine the MSB portion. When the MSB portion (two MSB bits) has been estimated, the decoder 120 buffers and records this MSB portion.

After estimating the MSB portion, the decoder 120 is used with the comparator circuit 115 and the second DAC 110 to estimate the LSB portion based on the MSB portion and the successive approximation procedure. When beginning execution of the successive approximation procedure, the decoder 120 is arranged to control the on/off states of switches (e.g. NMOS transistors) in the second DAC 110 so as to provide different electric charges for the comparator blocks 115A-115C at different times. By step-by-step controlling the on/off states of NMOS transistors in the second DAC 110 to exert different reference levels on the analog input signal $V_{in}$ at different times, the decoder 120 gradually increases/charges the level of the analog input signal $V_{in}$ to make the level approach to a first reference level corresponding to the estimated MSB portion. After the level is enough close to the first reference level corresponding to the estimated MSB portion, the decoder 120 can determine the LSB portion based on the on/off states of the above-described NMOS transistor switches. Thus, the digital codeword of the digital output signal $V_{out}$ is determined since the MSB and LSB portions have been estimated.

It should be noted that, the second reference levels are used for estimating the LSB portion, and in an implementation the second reference levels can be configured as a group of reference levels numbered $2^{LN}$ which are generated by uniformly dividing a level range of $0.25V_r$. For example, the second reference levels can be different reference levels numbered 64. In another implementation, the second reference levels (64 different levels) can be generated by a group of levels that is numbered N smaller than 64. This can be achieved by incorporating capacitive interpolation into the second DAC 110. An advantage of fewer voltage levels to implement the second reference levels is that the number of resistors in a resistor ladder used for generating the at least one first reference level and the second reference levels can be reduced greatly. Please note that in this embodiment, reference voltage levels inputted to the first DAC 105 and second DAC 110 are generated by using the above-mentioned resistor ladder (not shown in FIG. 1); however, this is not intended to be a limitation of the present invention.

Further, the settling for the first reference levels (e.g., $\frac{3}{4}*V_r$, $\frac{1}{2}*V_r$, and $\frac{1}{4}*V_r$) is very fast since it is merely required to charge the input capacitance of the comparator blocks 115A-115C, parasitic capacitors, and other transistor switches. The settling for the second levels $V_2$ is also fast. For example, with reference to estimating the most important bit of the LSB portion in this embodiment is arranged to cause the second DAC 110 to exert half of $\frac{1}{4}*V_r$ on the analog input signal Vin, rather than exerting half of $V_r$ on the analog input signal Vin. Therefore, compared to a conventional successive approximation procedure, the successive approximation procedure of the present invention does not require waiting for a longer capacitor charging settling time. That is, compared to the conventional successive approximation, the settling for the second levels $V_2$ in the embodiment becomes very fast. The above-mentioned description is merely used as an example for illustrative purposes but not intended to be a limitation of the present invention.

Figure 2:
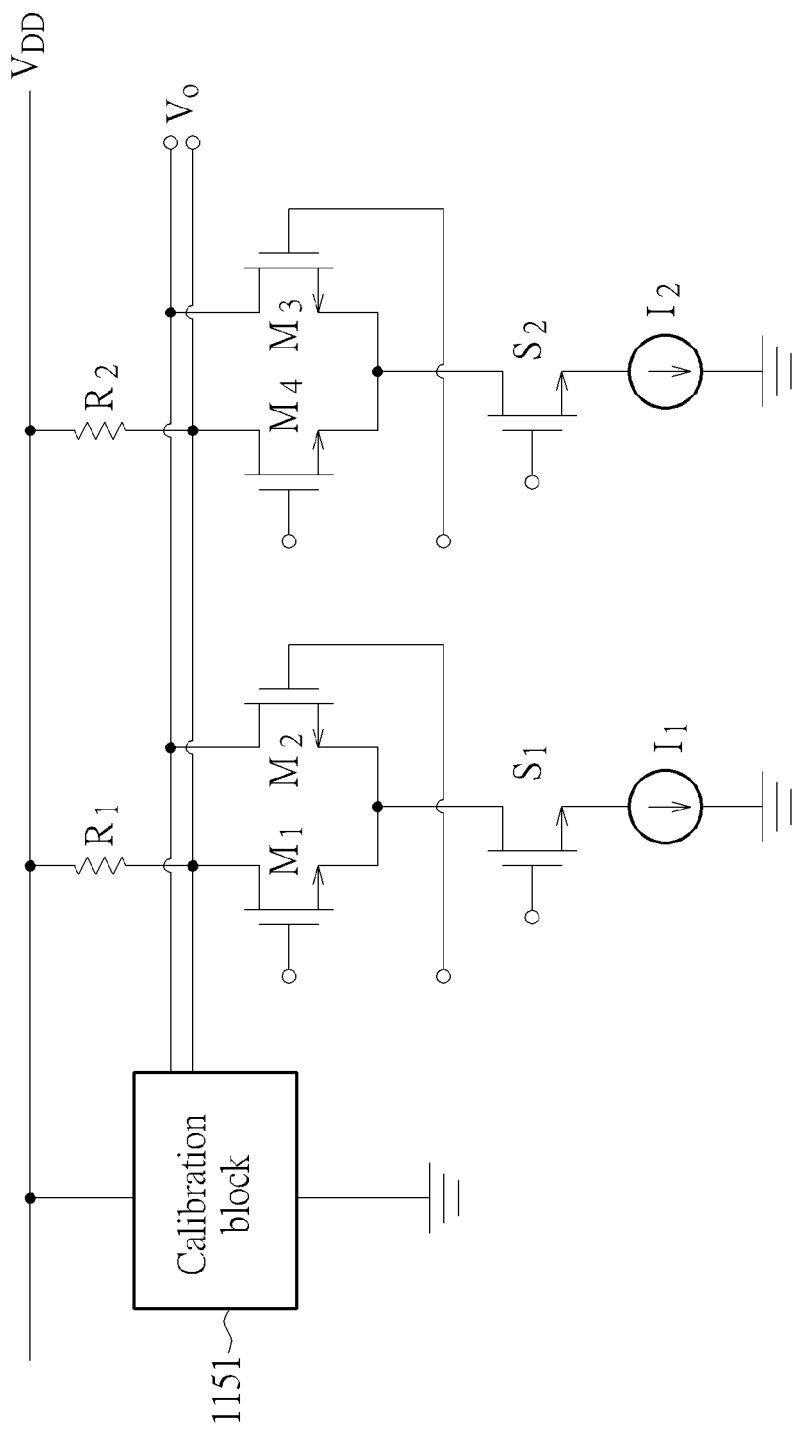
FIG. 2 is a diagram of a comparator block as shown in FIG. 1.

Please refer to FIG. 2, which depicts a diagram of a comparator block such as 115A-115C as shown in FIG. 1. The comparator block includes a calibration block 1151, resistors $R_1$-$R_2$, a plurality of transistors $M_1$-$M_4$ & $S_1$-$S_2$, and current sources $I_1$-$I_2$. The calibration block 1151 is arranged to generate and provide a calibrated differential signal $V_o$ for the transistors $M_1$-$M_4$. When performing SAR procedure, the comparator block is used for receiving one of the first reference levels $\frac{3}{4}*V_r$, $\frac{1}{2}*V_r$, and $\frac{1}{4}*V_r$ and a resultant signal generated by gradually adding different second reference levels to the analog input signal $V_{in}$. All signals or levels are configured to be implemented by differential signals. However, this is not meant to be a limitation of the present invention. As shown in FIG. 2, transistors $M_1$-$M_4$ are turned off during the sampling period for the analog input signal $V_{in}$ to avoid a non-linear input capacitance due to unbalanced bias current. For each comparator block, a corresponding coarse reference level (e.g. one of the first reference levels $\frac{3}{4}*V_r$, $\frac{1}{2}*V_r$, and $\frac{1}{4}*V_r$) is applied to gate terminals of the transistor switches $M_1$ and $M_3$ for estimating the MSB portion. During the period of the successive approximation procedure, the resultant signal $V_2$ (i.e. a combination of the analog input signal $V_{in}$ with a corresponding second reference level) is applied to gate terminal of the transistor switches $M_2$ and $M_4$ of the comparator block. The common mode voltage of both the input differential pairs is kept the same during the whole conversion period. This design ensures that the maximum gain can be achieved.

Figure 3A:
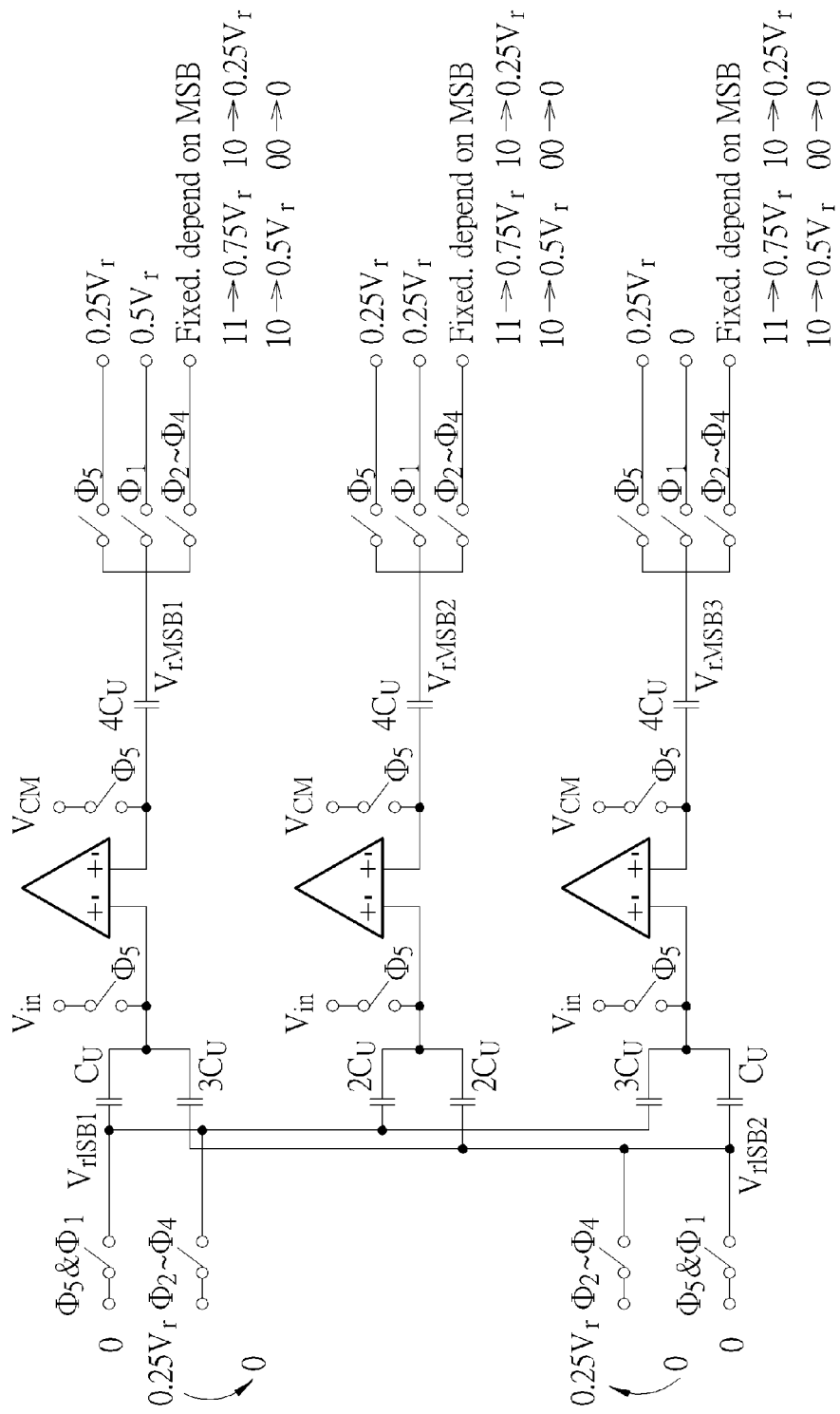
FIG. 3A in conjunction with FIG. 3B are a diagram of the detail circuitry elements of capacitors and comparator blocks according to an embodiment of the present invention and a diagram of the proposed ADC timing sequence according to this embodiment of the present invention.
Figure 3B:
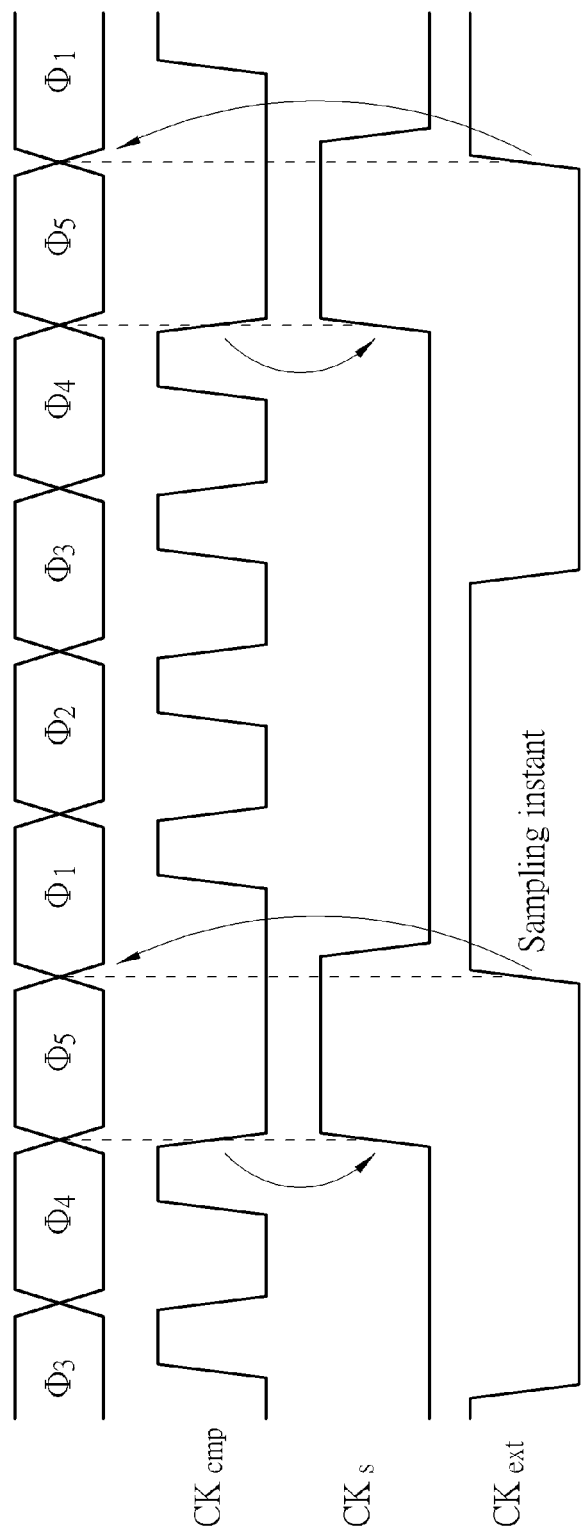

In order to more clearly describe the operations of estimating the most and least significant bit portions of this embodiment, FIG. 3A in conjunction with FIG. 3B respectively depict a diagram of the detail circuitry elements of capacitors and comparator blocks 115A-115C according to another embodiment of the present invention and a diagram of the proposed ADC timing sequence according to this embodiment of the present invention. As shown in FIG. 3A in conjunction with FIG. 3B, each comparator block includes two differential input pairs. At $\Phi_5$, the analog input signal $V_{in}$ and ($V_{CM}$–0.25$V_r$) are sampled in capacitors of $4C_U$ ($C_u$ represents an unit capacitance). At the beginning of first conversion cycle $\Phi_1$, 0.5$V_r$, 0.25$V_r$ and zero are connected to corresponding bottom plates ($V_{rMSB1}$, $V_{rMSB2}$, and $V_{rMSB3}$) of capacitors for comparison of the most significant bit portion. The settling of the first reference levels is very fast because the resistor ladder (not shown in FIG. 1) only needs to charge input capacitances of the comparator blocks 115A-115C and parasitic capacitor of $4C_U$ and six transistor switches. After the most significant bit portion is determined, $V_{rMSB1}$-$V_{rMSB3}$ are decided and fixed in the conversion cycle of the least significant bit portion. At beginning of successive approximation procedure conversion $\Phi_2$, $V_{rLSB1}$ is switched to 0.25$V_r$ and $V_{rLSB2}$ is kept at the ground level. The required second levels for the conversion of least significant bit portion are established by capacitive interpolation, and fast settling can be achieved due to reduced reference range of 0.25$V_r$ and low turn-on resistance of NMOS transistor switches. In $\Phi_2$-$\Phi_4$, $V_{rLSB1}$ switches downward to zero while $V_{rLSB2}$ switches upward to 0.25$V_r$. The monotonic switching procedure costs less power than a conventional successive approximation ADC that is based on a trial-and-error search procedure.

Further, in order to prevent from using a high-frequency input clock, the proposed ADC timing sequence shown in FIG. 3B adopts an asynchronous timing scheme, and corresponding control signals are generated internally. The analog input signal $V_{in}$ is sampled at rising edge of the signal $CK_S$ that is triggered by $CK_{cmp}$ internally at the end of previous conversion period. The sampling instant is decided by rising edge of external clock $CK_{ext}$ with arbitrary duty cycle.

In summary, in the embodiments of the present invention, by using the first DAC 105 with the comparator circuit 115, fast settling of the reference level (s) for the comparison of the most significant bit portion is obtained. Further, by using the capacitive interpolation, a number of NMOS transistor switches can be reduced, and a matching requirement of corresponding circuitry elements can be lowered down. In addition, the need of specific duty cycle of an external clock for defining sampling period in a conventional asynchronous successive approximation analog-to-digital converter can be avoided by using the timing sequence proposed in FIG. 3B. In addition, according to the above-mentioned design, the analog-to-digital conversion apparatus 100 consumes less power and occupies a smaller area of a chip die. Also, a large number of switches and a complicated routing are reduced greatly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method utilized in an analog-to-digital conversion apparatus, for converting an analog input signal into a digital output signal, the digital output signal including a most significant bit portion and a least significant bit portion, the method comprising:
   using a comparator circuit to compare the analog input signal with at least one first reference level to generate a preliminary comparison result without using a successive approximation procedure, the at least one first reference level being used for determining the most significant bit portion;
   estimating the most significant bit portion according to the preliminary comparison result;
   based on the preliminary comparison result, performing the successive approximation procedure to obtain a posterior comparison result according to a plurality of second reference levels, the second reference levels being used for determining the least significant bit portion; and
   estimating the least significant bit portion according to the posterior comparison result.

2. The method of claim 1, further comprising:
   performing an estimation of the most significant bit portion and an estimation of the least significant bit portion by using a same comparator circuit.

3. The method of claim 2, wherein the step of performing the successive approximation procedure to obtain the posterior comparison result comprises:
   performing the successive approximation procedure to obtain the posterior comparison result by using the comparator circuit to compare the at least one first reference level with a level generated from the analog input signal and the second reference levels.

4. The method of claim 1, wherein a level range of the second reference levels is a portion of a full swing range of the analog input signal rather than the full swing range.

5. The method of claim 1, wherein the most significant bit portion includes MN bit(s), and the level range of the second reference levels is determined by dividing the full swing range by $2^{MN}$, wherein MN is a positive integer.

6. An analog-to-digital conversion (ADC) apparatus for converting an analog input signal into a digital output signal, the digital output signal including a most significant bit portion and a least significant bit portion, the analog-to-digital conversion apparatus comprising:
   a first digital-to-analog converter (DAC), for providing at least one first reference level for a comparator circuit, the at least one first reference level being used for determining the most significant bit portion;
   a second DAC, for providing a plurality of second reference levels for the comparator circuit, the second reference levels being used for determining the least significant bit portion;
   the comparator circuit, coupled to the first DAC and the second DAC, for comparing the analog input signal with the at least one first reference level to generate a preliminary comparison result without using a successive approximation procedure;
   a decoder, coupled to the comparator circuit, for estimating the most significant bit portion according to the preliminary comparison result;
   wherein based on the preliminary comparison result, the decoder is used with the comparator circuit to perform the successive approximation procedure to obtain a posterior comparison result according to the second reference levels, and the decoder is arranged to estimate the least significant bit portion according to the posterior comparison result.

7. The ADC apparatus of claim 6, wherein the comparator circuit is arranged to compare the at least one first reference level with a level generated from the analog input signal and the second reference levels, so as to perform the successive approximation procedure to obtain the posterior comparison result.

8. The ADC apparatus of claim 6, wherein a level range of the second reference levels is a portion of a full swing range of the analog input signal rather than the full swing range.

9. The ADC apparatus of claim 6, wherein the most significant bit portion includes MN bit(s), and the level range of the second reference levels is determined by dividing the full swing range by $2^{MN}$, wherein MN is a positive integer.

10. An analog-to-digital conversion (ADC) apparatus for converting an analog input signal into a digital output signal, the digital output signal including a first portion and a second portion, the analog-to-digital conversion apparatus comprising:

a first digital-to-analog converter (DAC), for providing at least one first reference level being used for determining the first portion;

a second DAC, for providing at least one second reference level being used for determining the second portion, and for sampling and storing the analog input signal;

a comparator circuit, coupled to the first DAC and the second DAC, for comparing the analog input signal with the at least one first reference level to generate a preliminary comparison result at an output of the comparator circuit, and generating a posterior comparison result at the output according to the analog input signal and the at least one second reference level; and a decoder, coupled to the comparator circuit, for estimating the first portion according to the preliminary comparison result, and estimating the second portion according to the posterior comparison result.

11. The ADC apparatus of claim 10, wherein the comparator circuit further comprises a first input coupled to the first DAC and a second input coupled to the second DAC.

* * * * *